(12) United States Patent
Chan et al.

(10) Patent No.: US 6,995,322 B2
(45) Date of Patent: Feb. 7, 2006

(54) HIGH SPEED CIRCUITIZED SUBSTRATE WITH REDUCED THRU-HOLE STUB, METHOD FOR FABRICATION AND INFORMATION HANDLING SYSTEM UTILIZING SAME

(75) Inventors: Benson Chan, Vestal, NY (US); John M. Lauffer, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1 day.

(21) Appl. No.: 10/955,741

(22) Filed: Sep. 30, 2004

(65) Prior Publication Data

US 2005/0039950 A1      Feb. 24, 2005

Related U.S. Application Data

(63) Continuation-in-part of application No. 10/354,000, filed on Jan. 30, 2003, now Pat. No. 6,828,514.

(51) Int. Cl.
  *H05K 7/06*      (2006.01)
(52) U.S. Cl. .................. 174/262; 174/260; 361/780; 333/12; 29/846; 29/852
(58) Field of Classification Search ............... 361/780, 361/792–795; 174/255, 262, 264, 266; 257/664, 257/691, 698, 728; 333/12, 246, 247
See application file for complete search history.

(56) References Cited

U.S. PATENT DOCUMENTS

| | | | |
|---|---|---|---|
| 4,902,610 A | 2/1990 | Shipley | |
| 5,110,664 A * | 5/1992 | Nakanishi et al. | 428/195.1 |
| 5,336,855 A | 8/1994 | Kahlert et al. | |
| 5,418,690 A | 5/1995 | Conn et al. | |
| 5,483,101 A | 1/1996 | Shimoto et al. | |
| 5,638,287 A | 6/1997 | Appel | |
| 5,754,410 A * | 5/1998 | Bardsley et al. | 361/777 |
| 5,768,109 A | 6/1998 | Gulick et al. | |
| 5,894,517 A | 4/1999 | Hutchison et al. | |
| 5,912,597 A | 6/1999 | Inagawa et al. | |
| 5,981,869 A | 11/1999 | Kroger | |
| 5,995,376 A * | 11/1999 | Schultz et al. | 361/788 |

(Continued)

FOREIGN PATENT DOCUMENTS

JP           02129731           1/1992

OTHER PUBLICATIONS

"Circuit-board design for 10-Gbit XFP optical modules", by Williams et al, EDN Magazine, May 29, 2003.

*Primary Examiner*—John B. Vigushin
(74) *Attorney, Agent, or Firm*—Lawrence R. Fraley; Hinman, Howard & Kattell, LLP

(57) ABSTRACT

A circuitized substrate including a plurality of conductive and dielectric layers and also a plurality of conductive thru-holes therein for passing high speed signals, e.g., from one component to another mounted on the substrate. The substrate utilizes a signal routing pattern which uses the maximum length of each of the thru-holes wherever possible to thereby substantially eliminate signal loss (noise) due to thru-hole "stub" resonance. A multilayered circuitized substrate assembly using more than one circuitized substrate, an electrical assembly using a circuitized substrate and one or more electrical components, a method of making the circuitized substrate and an information handling system incorporating one or more circuitized substrate assemblies and attached components are also provided.

29 Claims, 9 Drawing Sheets

U.S. PATENT DOCUMENTS

| | | |
|---|---|---|
| 6,023,211 A | 2/2000 | Somei |
| 6,075,211 A | 6/2000 | Tohya et al. |
| 6,075,423 A | 6/2000 | Saunders |
| 6,081,430 A | 6/2000 | La Rue |
| 6,084,306 A | 7/2000 | Yew et al. |
| 6,137,064 A * | 10/2000 | Kiani et al. .................. 174/266 |
| 6,146,202 A | 11/2000 | Ramey et al. |
| 6,160,718 A * | 12/2000 | Vakilian ..................... 361/803 |
| 6,175,506 B1 | 1/2001 | Takeuchi |
| 6,184,477 B1 * | 2/2001 | Tanahashi ................... 174/261 |
| 6,215,372 B1 | 4/2001 | Novak |
| 6,222,740 B1 | 4/2001 | Bovensiepen et al. |
| 6,246,010 B1 | 6/2001 | Zenner et al. |
| 6,268,283 B1 | 7/2001 | Huang |
| 6,288,902 B1 * | 9/2001 | Kim et al. .................. 361/725 |
| 6,333,857 B1 | 12/2001 | Kanbe et al. |
| 6,353,539 B1 | 3/2002 | Horine et al. |
| 6,431,914 B1 | 8/2002 | Billman |
| 6,441,313 B1 | 8/2002 | Novak |
| 6,444,922 B1 | 9/2002 | Kwong |
| 6,495,772 B2 | 12/2002 | Anstrom et al. |
| 6,526,519 B1 | 2/2003 | Cuthbert |
| 6,541,712 B1 | 4/2003 | Gately et al. |
| 6,545,876 B1 | 4/2003 | Kwong et al. |
| 6,570,271 B2 | 5/2003 | Slupe et al. |
| 6,601,125 B1 | 7/2003 | Campbell |
| 6,608,376 B1 | 8/2003 | Liew et al. |
| 6,662,250 B1 | 12/2003 | Peterson |
| 6,681,338 B1 | 1/2004 | Kollipara |
| 6,720,501 B1 | 4/2004 | Henson |
| 6,754,876 B2 | 6/2004 | Sasaki et al. |
| 6,822,876 B2 * | 11/2004 | Goergen ..................... 361/788 |
| 2002/0125967 A1 | 9/2002 | Garrett et al. |
| 2003/0151905 A1 * | 8/2003 | Gottlieb ..................... 361/780 |
| 2005/0029013 A1 * | 2/2005 | Lee .......................... 174/262 |

* cited by examiner

HIGH SPEED CIRCUITIZED SUBSTRATE WITH REDUCED THRU-HOLE STUB, METHOD FOR FABRICATION AND INFORMATION HANDLING SYSTEM UTILIZING SAME

CROSS REFERENCE TO CO-PENDING APPLICATION

This is a continuation-in-part application of Ser. No. 10/354,000, filed Jan. 30, 2003 Now U.S. Pat. No. 6,828,514 and entitled "High Speed Circuit Board And Method For Fabrication" (inventors: B. Chan et al).

TECHNICAL FIELD

This invention relates to circuitized substrates, a prime example being multilayered printed circuit boards (pcbs), which include a plurality of thru-holes therein for providing interconnections between different conductive (e.g., signal) layers which form part of the substrate. The invention also relates to methods of making such substrates as well as various products (e.g., information handling systems) capable of utilizing such substrates as part thereof. Most particularly, the invention relates to such substrates, methods and products wherein the substrate is what is referred to as the high speed type.

BACKGROUND OF THE INVENTION

As operational requirements increase for electronic structures such as electronic components, e.g., semiconductor chips and modules including same, which mount on circuitized substrates such as chip carriers and printed circuit boards (pcbs) and are coupled together through the substrate's circuitry, so too must the host substrate be able to compensate for same. One particular increase has been the need for higher frequency connections between the mounted components, which connections, as stated, occur through the underlying host substrate. Such connections are subjected to the detrimental effects, e.g., signal deterioration, caused by the inherent characteristics of such known substrate wiring. For example, signal deterioration is expressed in terms of either the "rise time" or the "fall time" of the signal's response to a step change. The deterioration of the signal can be quantified with the formula $(Z_0 * C)/2$, where $Z_0$ is the transmission line characteristic impedance, and C is the amount of the via capacitance. In a wire having a typical 50 ohm transmission line impedance, a plated through hole via having a capacitance of 4 pico farad (pf) would represent a 100 pico-second (ps) rise-time (or fall time) degradation, as compared to a 12.5 ps degradation with a 0.5 pf buried via of the invention defined in the afore-mentioned parent application. This difference is significant in systems operation at 800 MHz or faster, where there are associated signal transition rates of 200 ps or faster. The substrates as taught herein are capable of providing signal speeds in the range of at least about 3.0 to about 10.0 gigabits per second (Gb/s), which is indicative of the added complexity needed for such a final structure.

A typical high performance (high speed) substrate such as those used for known chip carriers and multilayered pcbs has not been able to provide wiring densities beyond a certain point due to limitations imposed by the direct current (dc) resistance maximum in connections between components (especially chips). Similarly, high speed signals demand wider lines than normal pcb lines to minimize the "skin effect" losses in long lines. To produce a pcb with all wide lines would be impractical, primarily because of the resulting excessive thickness needed for the final board. Such increased thicknesses are obviously unacceptable from a design standpoint. As exemplified by the examples cited in the patents identified below, various alternative techniques have been used in an attempt to provide such high speed signal handling, but these also typically require unacceptable modifications to the substrate which are not conducive to mass production and/or a product of relatively simple construction. As such, most of these also add to the final cost of the finished product.

As stated, the invention involves circuitized substrates and resulting assemblies which utilize what will be referred to herein as "thru-holes." These are typically plated (with metallurgy such as copper) openings which extend either partially or entirely through the substrate's thickness for interconnecting various layers and/or components to one another. Each thru-hole may interconnect several such layers and/or components. If located only internally of the multilayered structure, such thru-holes are often referred to simply as "vias", whereas if these extend a predetermined depth from one or more surfaces of the substrate they are referred to as "blind vias". If these extend substantially through the entire structure thickness, from one surface to another, these are often referred to in the art as "plated-thru-holes" (pths). By the term "thru-hole" as used herein is meant to include all three types of such openings. From the above description, known substrates including such thru-holes typically suffer from the above mentioned via capacitance-signal degradation problem, which can be greatly amplified if the thru-holes used are of extended length and many signals pass there-over but only for a partial length thereof. See more immediately below.

Yet another signal transmission problem with multilayered circuitized substrates which use thru-holes as part thereof is what is referred to as signal loss due to thru-hole "stub." Clearly, use of thru-holes of the type defined above is considered essential to provide maximum operational capabilities for the multilayered structure. However, when signals do not pass along the entire length of the thru-hole, e.g., these pass to an internal conductive layer also coupled to the thru-hole but at only a partial depth thereof, there arises a signal "conflict" because part of the signal tends to traverse the remaining length ("stub") of the thru-hole while another part will pass directly to the internal layer. The result of this "conflict" is signal "noise" or loss, due to the "rebound" of the traversing part of the signal. As explained herein, the invention is able to substantially eliminate such loss.

In U.S. Pat. No. 5,638,287, there are described signal routing circuits (e.g. on printed circuit cards or boards) which allegedly route pulse signals with very short rise times from a lossy driver to multiple devices. In these routing circuits, a complex network of conductors branches from a common junction adjacent the driver output into multiple (in the disclosed embodiment, three) conduction paths of unequal length. In accordance with the invention, the internal impedance of the driver is matched to the aggregate characteristic impedance of the branch paths, and a lossless compensating circuit is attached to a shortest branch path. The compensating circuit is designed to transfer signal reflections of predetermined form to the branching junction at the driver via the shortest branch. Without the compensating circuit, reflections presented to the branching junction from the shortest branch are dissimilar to reflections presented to that junction from other branch paths. Consequently, re-reflections return from the junction to the branches, causing distortions in signals sensed at the devices. However, with the compensating circuit connected in the shortest branch, reflections presented from that branch to the junction appear in a form matching reflections presented by the other branches; and the reflections from all branches then cancel at the driver junction. Consequently, signals sensed at the devices have considerably reduced distortions due to the absence of re-reflections. In a preferred embodiment, the compensating circuit consists of a printed circuit trace of predetermined length (representing a transmission line stub with predetermined phase delay characteristics) in series with a point capacitor (or several point capacitors) having predetermined capacitance (determining the shape of the compensating reflections). The compensating circuit, which extends beyond the end of the shortest branch, connects between the end of that branch and reference potential (e.g. ground). The end of the shortest branch is also attached to a device required to sense signals appearing at that point. A new method and polarized bridge device are disclosed for use in analyzing such networks in particular (and for analyzing transmission line effects in general). This method and device permit precise observation and comparison of reflections produced in branches of a network emanating from a common junction, and accurate determination of compensation suitable for modifying such reflections.

In U.S. Pat. No. 6,084,306, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,353,539, there is described a printed circuit board which includes a first component mounted on a first side of the printed circuit board. A second component has an identical pin-out as the first component. The second component is mounted on a second side of the printed circuit board. A first signal line connects a first land pad coupled to a first contact on the first component with a second land pad coupled to a corresponding first contact on the second component. A second signal line connects a third land pad coupled to a second contact on the first component with a fourth land pad coupled to a corresponding second contact on the second component. The first signal line has is equal in length to the second signal line. This patent discusses different via"stub" length.

In U.S. Pat. No. 6,526,519, there is described an apparatus and method for reducing the timing skew on a printed circuit board including a plurality of conductive traces interconnecting a first node and a second node. At least one section is removed from one printed circuit board trace to thereby sever a trace and prevent signals passing from the first node to the second node from following the severed trace. In this manner, signal path length can be adjusted to reduce timing skews in the circuit. Sections are removed from the traces by using a laser, CVD, a router, a plasma or by passing sufficient current through weakened areas of the traces.

In U.S. Pat. No. 6,541,712, there is described a multilayer printed circuit board which includes a via having a conductive upper portion, a conductive lower portion, and an electrically insulating intermediate portion between the upper and lower portions. In one embodiment, the insulating intermediate portion of the via is provided by a non-platable layer of the circuit board, as may be comprised of PTFE. Vias having a continuous conductive coating may be formed through clearance holes in the non-platable layer which are provided with a platable inner surface, either by filling the hole with a platable material, such as epoxy resin, prior to laminating the board or by chemically conditioning the non-platable material to make it platable. In a further embodiment, the insulating intermediate portion of the via has a narrower diameter than the conductive upper and lower portions. This patent discusses elimination of resonant"stub" noise by the plating of only selected portions of the holes in the board and also possibly inserting a conductive"plug" within the hole.

In U.S. Pat. No. 6,545,876, there is described a"technique" for reducing the number of layers in a multilayer circuit board. The multilayer circuit board has a plurality of electrically conductive signal layers for routing electrical signals to and from at least one electronic component mounted on a surface of the board. In one embodiment, the technique is realized by forming a first plurality of electrically conductive vias in the multilayer circuit board extending from the surface of the multilayer circuit board to a first of the plurality of electrically conductive signal layers, wherein the first plurality of electrically conductive vias are arranged so as to form a channel in a second of the plurality of electrically conductive signal layers beneath the first plurality of electrically conductive vias.

In U.S. Pat. No. 6,570,271, there is described an"apparatus" for routing signals to and from at least one circuit component (e.g., to another) that has a plurality of input/output leads and is positioned on the surface of a printed circuit board. This"apparatus" includes a support structure having a first side and a second side, the first side being adapted for having the input/output leads of the circuit component attached thereto. A signal routing strip having a first end and a second end is also included. The first end of the routing strip is configured and adapted to be electrically connected to the input/output leads of the circuit component for transmitting signals to and from the circuit component.

In U.S. Pat. No. 6,601,125, there is described an integrated circuit package for electrically interconnecting a first bus signal path disposed on a printed circuit board and a second bus signal path also disposed on the printed circuit board. The integrated circuit package may have a substrate, an integrated circuit chip die supported by the substrate. The interconnection network may be for electrically connecting the first bus signal path and the second bus signal path to a chip pad on the chip die. Thus, the first bus signal path and the second bus signal path may be electrically interconnected by only the interconnection circuit.

In U.S. Pat. No. 6,608,376, there is described an integrated circuit package that allows high density routing of signal lines. A substrate of the package may include an upper surface upon which a bonding finger resides, a lower surface upon which a solder ball resides, and a signal conductor plane on which a signal trace conductor resides at a dielectrically spaced distance between the upper surface and the lower surface. A via extends perpendicularly from the upper surface, connecting the bonding finger to the first portion of the signal trace conductor. A second via extends perpendicularly from the lower surface, connecting the solder ball to the second portion of the signal trace conductor. The routing of the vias and signal trace conductors causes the signal lines to either fan into or away from the area of the integrated circuit package adapted to receive the integrated circuit In U.S. Pat. No. 6,662,250, there is described a bus routing strategy for a printed circuit board. The routing strategy ensures that traces coupled to a plurality of synchronous devices are not routed through the center region of each package, ensuring that each trace in a bus is approximately the same length. This apparently serves to minimize the length over which"neck-down" occurs, and ensures that traces are routed without making sharp turns. By using this routing strategy, propagation time differences within each trace group are allegedly minimized. This patent also mentions that the center regions of the printed circuit board under each package are available for vias connected to bypass capacitors.

In U.S. Pat. No. 6,681,338, there are described a method and a system for reducing signal skew caused by dielectric material variations within one or more module substrates. In one embodiment, an elongate module substrate having a long axis includes multiple signal routing layers supported by the module substrate. Multiple devices, such as memory devices (e.g. DRAMs) are supported by the module substrate and are operably connected with the signal routing layers. Multiple skew-reducing locations (e.g. vias) within the module permit signals that are routed in two or more of the multiple signal routing layers to be switched to a different signal routing layer. The skew-reducing locations can be arranged in at least one line that is generally transverse the long axis of the module substrate. The lines of skew-reducing locations can be disposed at various locations on the module. For example, a line of skew-reducing locations can be disposed proximate the middle of the module to effectively offset skew. Multiple skew-reducing locations can be provided at other locations within the module as well so that the signals are switched multiple different times as they propagate through the module.

In U.S. Pat. No. 6,720,501, there is described a multilayer printed circuit board having clustered blind"vias" (a partial depth thru-hole, as explained in greater detail herein-below) in power layers to facilitate the routing of signal traces in signal layers. A portion of the blind vias in the power layers are grouped together to form a cluster of blind vias. Corresponding signal routing channels are provided in the signal layers and aligned with the cluster of blind vias in the power layers to permit routing of signal traces or signal circuitry there-through. A method of manufacturing the multilayered printed circuit board includes assembling a first subassembly of power layers, forming a group of clustered power vias through the first subassembly, assembling a second subassembly of signal layers, combining the first subassembly with the second subassembly such that the clustered vias in the first subassembly align with signal routing channels in the second subassembly, forming signal vias that extend through the first and second subassemblies, and seeding or plating the power and signal vias.

Various other circuitized substrates are described in the following patents:

| | |
|---|---|
| 4,902,610 | C. Shipley |
| 5,336,855 | J. Kahlert et al |
| 5,418,690 | R. Conn et al |
| 5,768,109 | J. Gulick et al |
| 5,891,869 | S. Lociuro et al |
| 5,894,517 | J. Hutchinson et al |
| 6,023,211 | J. Somei |
| 6,075,423 | G. Saunders |
| 6,081,430 | G. La Rue |
| 6,146,202 | S. Ramey et al |
| 6,222,740 | K. Bovensiepen et al |
| 6,246,010 | R. Zenner et al |
| 6,431,914 | T. Billman |
| 6,495,772 | D. Anstrom et al |
| US2002/0125967 | R. Garrett et al |
| JP4025155A2 | O. Takashi |

The teachings of all of the above documents are incorporated herein by reference.

As understood from the following, a primary purpose of the present invention is to provide an improved circuitized substrate which provides for enhanced high speed connections between electronic components mounted on the substrate by an enhanced signal routing system within the substrate which utilizes the maximum length of the thru-holes and thus substantially eliminates signal loss due to thru-hole"stub."

It is believed that such a substrate, a method of making same, a multilayered circuitized substrate assembly utilizing two or more such substrates, an electrical assembly using at least one circuitized substrate and having at least one electrical component mounted thereon, and an information handling system using such a substrate (and assemblies) would represent significant advancements in the art.

OBJECTS AND SUMMARY OF THE INVENTION

It is, therefore, a primary object of the present invention to enhance the circuitized substrate art by providing such a substrate capable of high speed signal passage to interconnect electronic components mounted on the substrate.

It is another object of the invention to provide a method of making such a substrate, as well as a multilayered circuitized substrate assembly comprised of more than one such substrates, an electrical assembly having a circuitized substrate and at least one electronic component mounted thereon, and also an information handling system adapted for using such a substrate.

According to one aspect of the invention, there is provided a high speed circuitized substrate comprising a plurality of electrically conductive layers, a plurality of dielectric layers alternately positioned between selected pairs of the electrically conductive layers and electrically insulating the conductive layers from each other, and a plurality of thru-holes spacedly positioned within the substrate and extending through selected ones of the dielectric layers and electrically conductive layers for electrically interconnecting selected ones of the electrically conductive layers to another of the electrically conductive layers to allow the passage of electrical signals between these interconnected electrically conductive layers. The electrical signals pass through the maximum length of the thru-holes so as to substantially eliminate signal loss due to thru-hole stub.

According to another aspect of the invention, there is provided a method of making a high speed circuitized substrate, the method comprising providing a plurality of electrically conductive layers, providing a plurality of dielectric layers and alternately positioning selected ones of these dielectric layers between selected pairs of the electrically conductive layers so as to electrically insulate the conductive layers from each other, forming a plurality of thru-holes within the substrate in a spaced orientation such that the plurality of thru-holes extend through selected ones of the dielectric and electrically conductive layers to electrically interconnect selected ones of the electrically conductive layers to another of the electrically conductive layers so as to allow the passage of electrical signals between these interconnected electrically conductive layers. The electrical signals pass through the maximum length of the thru-holes so as to substantially eliminate signal loss due to thru-hole stub.

According to yet another aspect of the invention, there is provided an electrical assembly comprising a high speed circuitized substrate including a plurality of electrically conductive layers, a plurality of dielectric layers alternately positioned between selected pairs of the electrically conductive layers and electrically insulating these conductive layers from each other, a plurality of thru-holes spacedly positioned within the substrate and extending through selected ones of the dielectric and electrically conductive layers for electrically interconnecting selected ones of the electrically conductive layers to another of the electrically conductive layers to allow the passage of electrical signals between these interconnected electrically conductive layers. The electrical signals pass through the maximum length of the thru-holes so as to substantially eliminate signal loss due to thru-hole stub. The assembly further includes at least one electrical component positioned on and electrically coupled to said circuitized substrate.

According to still another aspect of the invention, there is provided a high speed circuitized substrate assembly comprising a first high speed circuitized substrate including a first plurality of electrically conductive layers and a first plurality of dielectric layers alternately positioned between selected pairs of the first electrically conductive layers and electrically insulating the first electrically conductive layers from each other, a second high speed circuitized substrate including a second plurality of electrically conductive layers and a second plurality of dielectric layers alternately positioned between selected pairs of the second electrically conductive layers and electrically insulating the second electrically conductive layers from each other, the second circuitized substrate bonded to the first circuitized substrate to form a circuitized subassembly, and a plurality of thru-holes positioned with the high speed circuitized subassembly and electrically interconnecting selected ones of the first and second pluralities of electrically conductive layers to allow the passage of electrical signals between the interconnected electrically conductive layers. The electrical signals pass through the maximum length of the thru-holes so as to substantially eliminate signal loss due to thru-hole stub.

According to another aspect of the invention, there is provided an information handling system comprising a housing, a high speed circuitized substrate positioned within the housing and including a plurality of electrically conductive layers, a plurality of dielectric layers alternately positioned between selected pairs of the electrically conductive layers and electrically insulating these conductive layers from each other, a plurality of thru-holes spacedly positioned within the substrate and extending through selected ones of the dielectric and electrically conductive layers for electrically interconnecting selected ones of the electrically conductive layers to another of the electrically conductive layers to allow the passage of electrical signals between the interconnected electrically conductive layers, the electrical signals passing through the maximum length of the thru-holes so as to substantially eliminate signal loss due to thru-hole stub. This system further includes at least one electrical component positioned on and electrically coupled to the circuitized substrate.

BEST MODE FOR CARRYING OUT THE INVENTION

Figure 1:
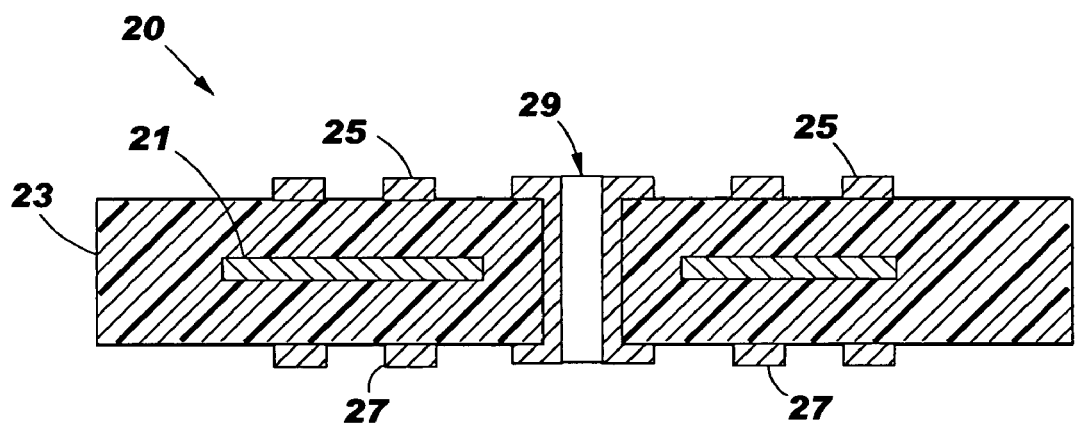
FIG. 1 is a side elevational view, in section, of one portion of a multilayered circuitized substrate (one example as defined in the above parent application being a PCB) according to one aspect of the invention defined in the parent application.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

As stated above, the term "high speed" as used herein is meant signals of high frequency. Examples of such signal frequencies attainable for the circuitized substrates defined herein and as produced using the methods taught herein include those within the range of from about 3.0 to about 10.0 gigabits per second (Gb/s). These examples are not meant to limit this invention, however, because frequencies outside this range, including those higher, are attainable. As further understood from the following, the circuitized products produced herein may be formed of at least two separate layered portions which have themselves been formed prior to bonding to each other. At a minimum, each of these separate portions will include at least one dielectric layer and one conductive layer, with most likely embodiments including several layers of each as part thereof. Each may also include one or more thru-holes for aligning with associated thru-holes in the other(s) substrate(s) to which it will be bonded. It is also within the scope of the invention to form a plurality of such substrates, including those having thru-holes and those not, with each other and thereafter (bonding) providing thru-holes in the bonded (laminated) multilayered structure. Examples are provided below and are just that (only examples) and the numbers of layers shown and described are not meant to limit the scope of this invention.

The following terms will also be used herein and are understood to have the meanings associated therewith.

By the term "circuitized substrate" is meant to include substrates having at least two dielectric layers and two conductive layers, and, in most cases, a plurality of thru-holes therein. In many cases, such substrates will include several dielectric, conductive layers and thru-holes. Examples include structures made of dielectric materials such as fiberglass-reinforced epoxy resins (some referred to as "FR-4" dielectric materials), polytetrafluoroethylene (Teflon), polyimides, polyamides, cyanate resins, photoimageable materials, and other like materials wherein the conductive layers are each a metal layer (e.g., power, signal or ground) comprised of suitable metallurgical materials such as copper, but may include or comprise additional metals (e.g., nickel, aluminum, etc.) or alloys thereof. If the dielectric materials for the structure are of a photoimageable material, it is photoimaged or photopatterned, and developed to reveal the desired circuit pattern, including the desired opening(s) as defined herein, if required. The dielectric material may be curtain-coated or screen- applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick, but also thicker if desired. Significantly, and as mentioned above, it is possible to form a composite multilayered structure of many such substrates wherein one or more may already have thru-holes as part thereof with other substrates having none and, following alignment and lamination, providing thru-holes in the final structure. These subsequently provided thru-holes may extend through the entire thickness of the final structure and/or occupy only a predetermnined depth therein. It is also possible to form a multilayered structure having several circuitized substrates with no pre-formed thru-holes and, following lamination, providing such full and partial depth thru-holes in the final structure. Still further, such a final structure as formed herein may be formed from individual circuitized substrates each having one or more thru-holes therein wherein the substrates are aligned such that the thru-holes are aligned, and then bonding (lamination) occurs. The resulting multilayered structure will include several aligned thru-holes and, possible, others internally formed (internal "vias").

By the term "circuitized substrate assembly" as used herein is meant to include at least two of such circuitized substrates in a bonded configuration, one example of bonding being conventional lamination procedures known in the art and another being the use of conductive paste to couple two formed substrates along a common pattern of conductors (e.g., thru-holes).

By the term "electrical component" as used herein is meant components such as semiconductor chips, resistors, capacitors and the like, which are adapted for being positioned on the external conductive surfaces of such substrates as PCBs and possibly electrically coupled to other components, as well as to each other, using, for example the PCB's internal and/or external circuitry.

By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. duPont deNemours and Company under the trade designation CB-100, Ablebond 8175 from the Ablestick Company and filled polymeric systems, thermoset or thermoplastic type, containing transient liquid conductive particles or other metal particles such as gold, tin, palladium, copper, alloys, and combinations thereof. One particular example is coated copper paste. Metal coated polymeric particles disposed in a polymeric matrix can also be used.

By the term "sticker sheet" as used herein is meant to include dielectric materials such as conventional pre-preg materials used in conventional, multilayered pcb construction, e.g., usually by lamination. Other examples include the products Pyrolux and liquid crystal polymer (LCP) or other freestanding films. These dielectric sticker sheets may be adhesively applied to one or both of the two circuitized substrates to assist in bonding these two components. These sheets may also be patterned, e.g., by laser or photoimaging, if desired. Significantly, such sheets can also include a conductive plane (including signal, ground and/or power) therein to further increase the circuit density of the finished, bonded product taught herein. Such sticker sheets may be typically 5 to 8 mils (thousandths) thick.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional pcb having several external components such as resistors, capacitors, modules (including one or more chip carriers) etc. mounted thereon and coupled to the internal circuitry of the pcb.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more pcbs, chip carriers, etc. as integral parts thereof. For example, a pcb typically used includes a plurality of various components such as chip carriers, capacitors, resistors, modules, etc. mounted thereon. One such pcb can be referred to as a "motherboard" while various other boards (or cards) may be mounted thereon using suitable electrical connectors In FIGS. 1 and 2, there are shown two embodiments of multilayered portions 20 and 20', respectively, which, when bonded to another multilayered portion will form the circuitized substrate (the example referenced in the parent application being a printed circuit board) according to a preferred embodiment of the invention in the identified parent application listed above. Accordingly, portions 20 and 20' will be defined herein as second portions while the other portion will be referred to as the first (or base) portion. It is to be understood that in accordance with the broad aspects of this invention, at least one second portion is to be bonded to the first portion such that this second portion lies substantially along the external portions of the final product. It is also understood that one or more of such second portions may be bonded to the base, first portion, including on opposite sides thereof such as depicted in FIGS. 3–6. Most significantly, the second portions as defined herein are specifically designed for providing high frequency (high speed) connections between electronic components such as chip modules or even simply individual chips mounted (e.g., soldered) to the second portions and/or otherwise electrically coupled thereto. Importantly, the first or base portion will not necessarily require such capability but instead can be formed in the regular manner for most current pcbs, many of which are described in the above-listed documents. This invention thus allows the utilization of known pcb manufacturing techniques to produce a resulting structure with significantly increased capability such that electronic components secured thereto can be connected at higher speeds than heretofore attainable. Such connections are considered essential in the rapidly expanding pcb art due primarily to the corresponding increased requirements of such components. The invention as defined in the parent application thus provides a significant advancement in the art. With respect to the teachings in the parent application as same relate to substrate formation, it is further understood that said teachings are applicable in many respects with regard to the teachings of the instant invention herein. Most importantly, the teachings relating to layer formation (including circuitization), layer and substrate lamination, thru-hole formation, etc. as taught in the parent application are equally applicable to the present invention.

Figure 2:
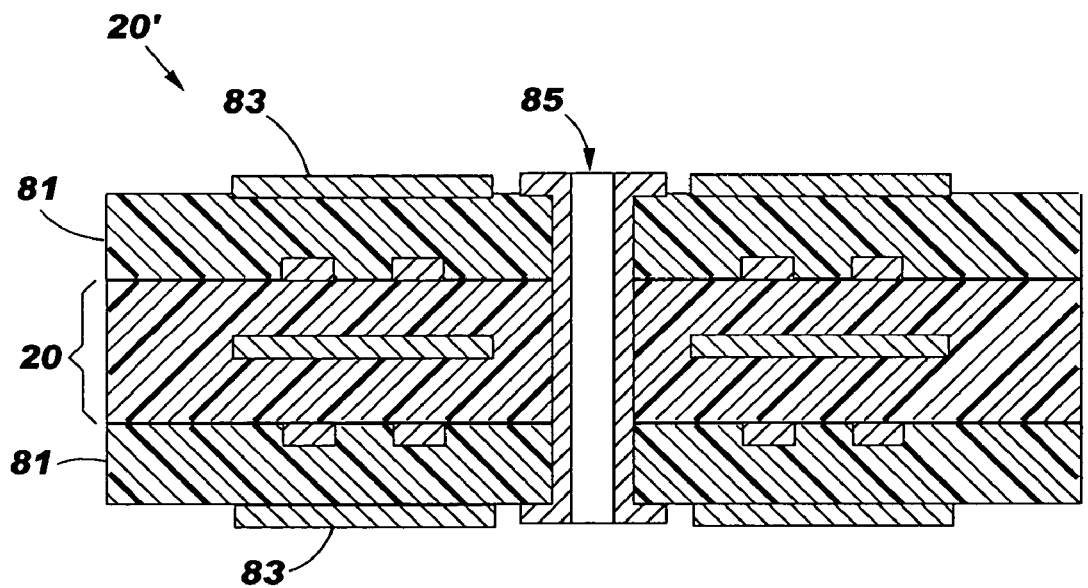
FIG. 2 is a side elevational view, in section, of one portion of a multilayered PCB according to another aspect of the invention in the parent application.

In FIG. 1, multilayered portion 20 is shown as including a central conducting plane 21 which, in a preferred embodiment, serves as a power plane. Plane 21 is surrounded by two layers of dielectric material 23, shown in the drawing as one continuous structure due to the bonding (lamination) of both layers onto plane 21. On the external surfaces of dielectric material 23 are located additional conductive planes 25 and 27, which in a preferred embodiment of the parent application invention comprise a series of signal lines. Portion 20 can thus be simply referred to as a 2S1P structure, meaning it comprises two signal planes and one power plane. A conductive thru-hole 29 is also provided to connect the upper signal plane 25 with lower plane 27. In a preferred embodiment, the conductive thru-hole is a plated through hole (pth), produced using known technologies. The formation of portion 20 is accomplished using known pcb procedures, including lamination of the aforementioned dielectric layers and deposition (e.g., plating) of the external signal planes. Further process description is thus not believed necessary.

As mentioned, portion 20 is designed for providing high speed (high frequency) connections between electronic components coupled thereto when portion 20 is formed in combination with another multilayered portion to form a final substrate structure. In order to provide such high speed connections, therefore, the individual signal lines in portion 20 (and 20') as defined in the parent application (and as usable in the present invention) preferably possess a width of from about 0.005 inch to about 0.010 inch and a thickness of 0.0010 to about 0.0020 inch. The corresponding dielectric layers in both inventions also each possess a thickness of preferably from about 0.004 inch to about 0.010 inch, or, more specifically, a thickness necessary to assure a desired signal line impedance. The material for planes 21, 25 and 27 is preferably copper, but other conductive materials are possible. The preferred dielectric material 23 is a low loss dielectric, one example being polyclad LD621, available from Cookson Electronics, located in West Franklin, N.H. Additional materials include Nelco 6000SI, available from Park Nelco, located in Newburgh, N.Y. and Rogers 4300, available from Rogers Corporation, located in Rogers, Conn. These materials have a low dielectric constant and loss factor to provide the optimum operational capabilities for the structure. Other materials possessing dielectric loss <0.01, and preferably less than <0.005 would be suitable for use in both portions 20 and 20'. Dielectric materials as also discussed above may also be used instead of those represented by these three examples.

It is understood that the above thicknesses and defined materials are not meant to limit the scope of the parent application's invention as well as that of the instant invention, in that others are possible while attaining the desired results taught herein. In one example, using the aforementioned thicknesses, widths and materials, it was possible to provide a second portion 20 (and 20') capable of passing signals at a signal frequency within the range of from about 3 to about 10 gps. This is also not meant to limit the invention in that higher frequencies, e.g., 12 gps, are possible with relatively insignificant modification to one or more of the above materials, parameters, etc. The resulting overall thickness for portion 20 as defined, according to one embodiment, is less than about 0.140 inch.

Although it is not a necessary requirement of the parent and present inventions, the aforementioned widths and thicknesses for the conductive planes and dielectric layers will normally be thicker than those for the base or first multilayered portion to which portions 20 and 20' will be bonded. That is, the base portions will typically include much less thickness and width dimensions for the conductive planes and dielectrics used therein, such widths, thicknesses and materials being typical of those of known PCB structures used today. Thus, further description will not be necessary.

Figure 3:
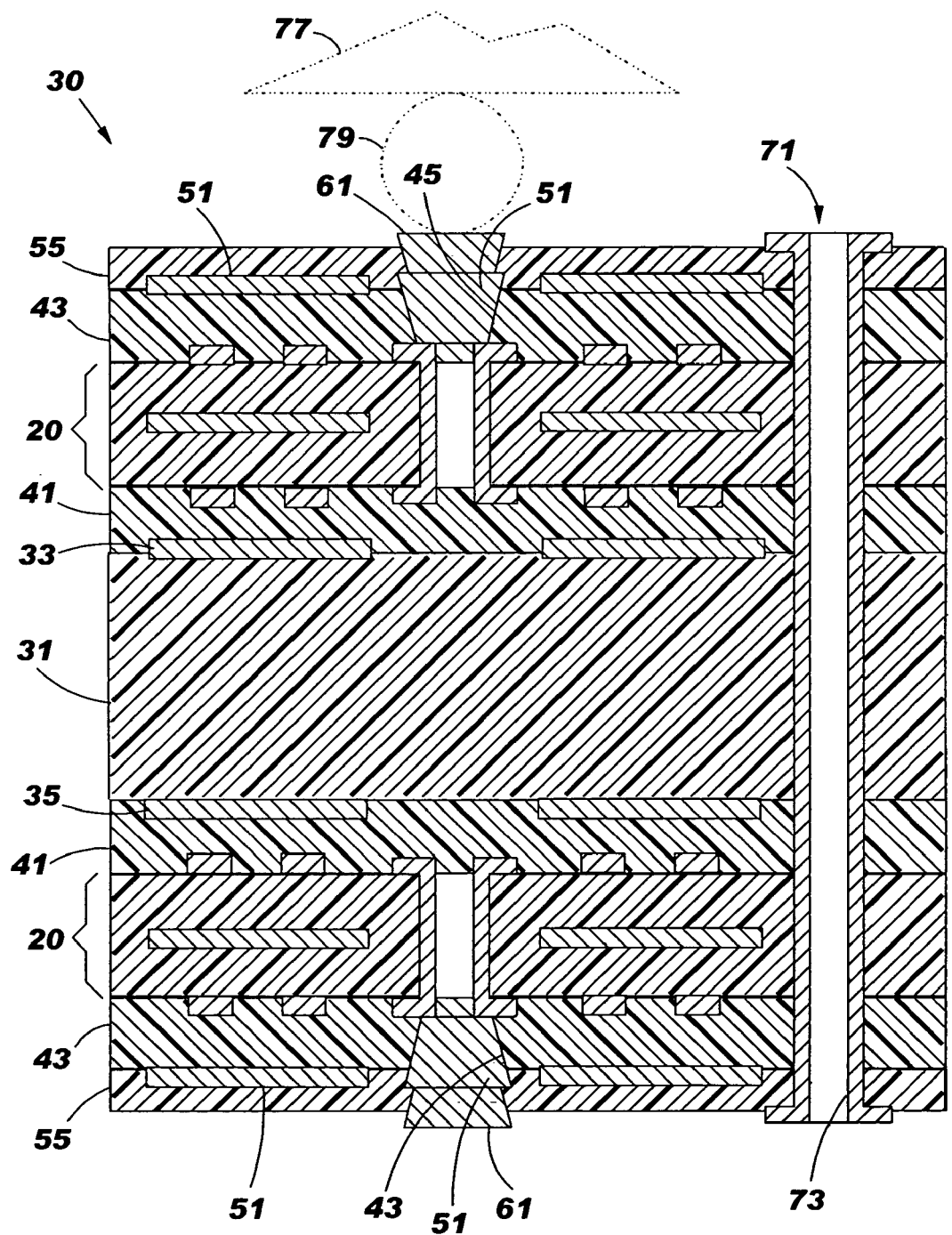
FIG. 3 is a side elevational view, in section, of a multilayered PCB according to one aspect of the invention in the parent application.

FIG. 3 illustrates an embodiment of a printed circuit board 30 taught within the parent application in which two second portions 20 are utilized, each of these portions located on opposite sides of a common first multilayered portion 31. First portion 31 is illustrated, for simplication purposes, as a singular dielectric layer including outer conductive layers 33 and 35 thereon. In one embodiment, layers 33 and 35 are power or ground planes, depending on the operational requirements of the final board 30. In a preferred embodiment, portion 31 includes several (e.g., twenty) conductive planes therein of signal, ground and/or power capabilities and a corresponding plurality (e.g., nineteen) of dielectric layers. In its simplest form, portion 31 (and 31' in FIGS. 4–6) include at least one signal plane passing signals therealong at a first, high speed frequency. As indicated earlier, both conductive planes and dielectric layers used in the first mulitlayered portion 31 are typically those utilized in a conventional pcb. Therefore, in one example, portion 31 may include conductive signal lines having widths of about 0.003 inch to about 0.010 inch and corresponding thicknesses of 0.0005 inch. The dielectric layers each include an initial thickness of about 0.003 inch to about 0.010 inch. First portion 31, being of such multilayered construction, is laminated together to bond the several conductive dielectric layers to form the first portion 31. Additionally, second portions 20 are similarly formed as separate, multilayered subassemblies as described above. In the next step, a dielectric layer 41 (e.g., conventional pre-preg material) is added to opposite sides of the interim first portion 31 and another dielectric layer 43 is added to each of the outermost surfaces of first portions 20. This structure is now laminated to form a singular, multilayered circuitized substrate assembly (the example in the parent being a multilayered pcb), using standard lamination processing. Because of the structural characteristics explained above and herein, at least some of the signal planes in second portions 20 and 20 ' may provide higher frequency signal passage than at least some of the signal lines in the conventional first portions 31 and 31 '. In a preferred embodiment taught in the parent application, all signal lines in the external portions possess such superior capabilities compared to the signal layers of the first portions these are bonded to. As understood from the following, this is not a necessary requirement in the instant invention, in which all signals may pass through the circuitized substrate at the same or almost the same frequency.

To access one or more of the outer conductive planes on each portion 20, openings 45 are provided within the outer dielectric layers 43. This is preferably done by laser or photo-printing operations known in the art. Following removal of the dielectric material, an outer conductive layer 51 is added on opposite sides of the structure in FIG. 3, including within the openings in the dielectric. At this point, connections for electrical components are provided on the pcb 30 that couple to the signal lines of portions 20 which in turn will assure high speed signal passage along these signal lines, including those on the upper and lower surfaces of each portion 20, to a second electrical component (not shown) also coupled to the circuitry of the same portion 20, e.g., at a site to the left of the viewer in FIG. 3. Such connection would also be provided through an opening in conductive material 51 as shown in FIG. 3.

It is understood in FIG. 3 that two or more electrical components, such as chip carriers, capacitors, resistors or, simply, semiconductor chips, can be mounted on each of the opposite sides of pcb 30 and coupled together with high frequency signals. The pcb of the invention in the parent application, as well as the circuitized substrates and substrate assemblies taught herein, are thus able to uniquely couple high speed components on opposite (or the same side if desired) surfaces thereof to assure a finished pcb (substrate subassembly) and component assembly possessing far greater operational capabilities than heretofore known in the art.

For additional coupling, another layer of dielectric material 55 may also be added to cover the conductive planes 51, in which case, connection to the conductive material 51 within opening 45 would be accomplished by a similar opening and conductive material 61 in FIG. 3 to electrically couple components on one side of pcb 30. A plated thru-hole (pth) 71 may be utilized to extend through the entire thickness of pcb 30, as illustrated to the right in FIG. 3. Such a thru-hole could be formed using conventional techniques and would include, e.g., a thin plated layer of conductive material (e.g., copper) on the surfaces thereof. This thru-hole may also be used to accept a conductive pin or the like if such an added component is desired. The pth 71 can also couple one or more components to internal conductive planes in first portion 31.

One example of an electrical component is illustrated in phantom in FIG. 3. Such a component, as mentioned above, may include an electronic module (chip carrier) or simply a semiconductor chip 77 coupled to the conductive material 61 (or, alternatively, directly to material 51 should material 61 not be utilized) using a solder ball 79. Alternatively, such a component could include a projecting metallic lead which in turn would be connected, e.g., soldered, to material 61. Such components and means of connection are known in the art and further description is not believed necessary.

Returning to FIG. 2, the portion 20' includes similar components to those of portion 20 in FIG. 1 but represents an alternative embodiment for forming a multilayered structure using the teachings herein and the parent application. Portion 20' includes as part thereof the 2S1P portion 20 therein. Dielectric layers 81 are added on opposite surfaces of portion 20, following which conductive layers 83 are then applied, e.g., via plating. The conductive layers 83 are preferably ground or power planes and are coupled together by a plated through hole 85 as shown. Like portion 20, several such thru-holes are utilized in the second portions to provide such connections. Only one is shown in both FIGS. 1 and 2 for illustration purposes, but more are shown and described in greater detail with respect to the embodiment of FIG. 9. Dielectric layers 81 are preferably of similar material as the low loss dielectric layers used in portion 20. The layers of portion 20', like portion 20, are assembled using conventional lamination processing.

Figure 4:
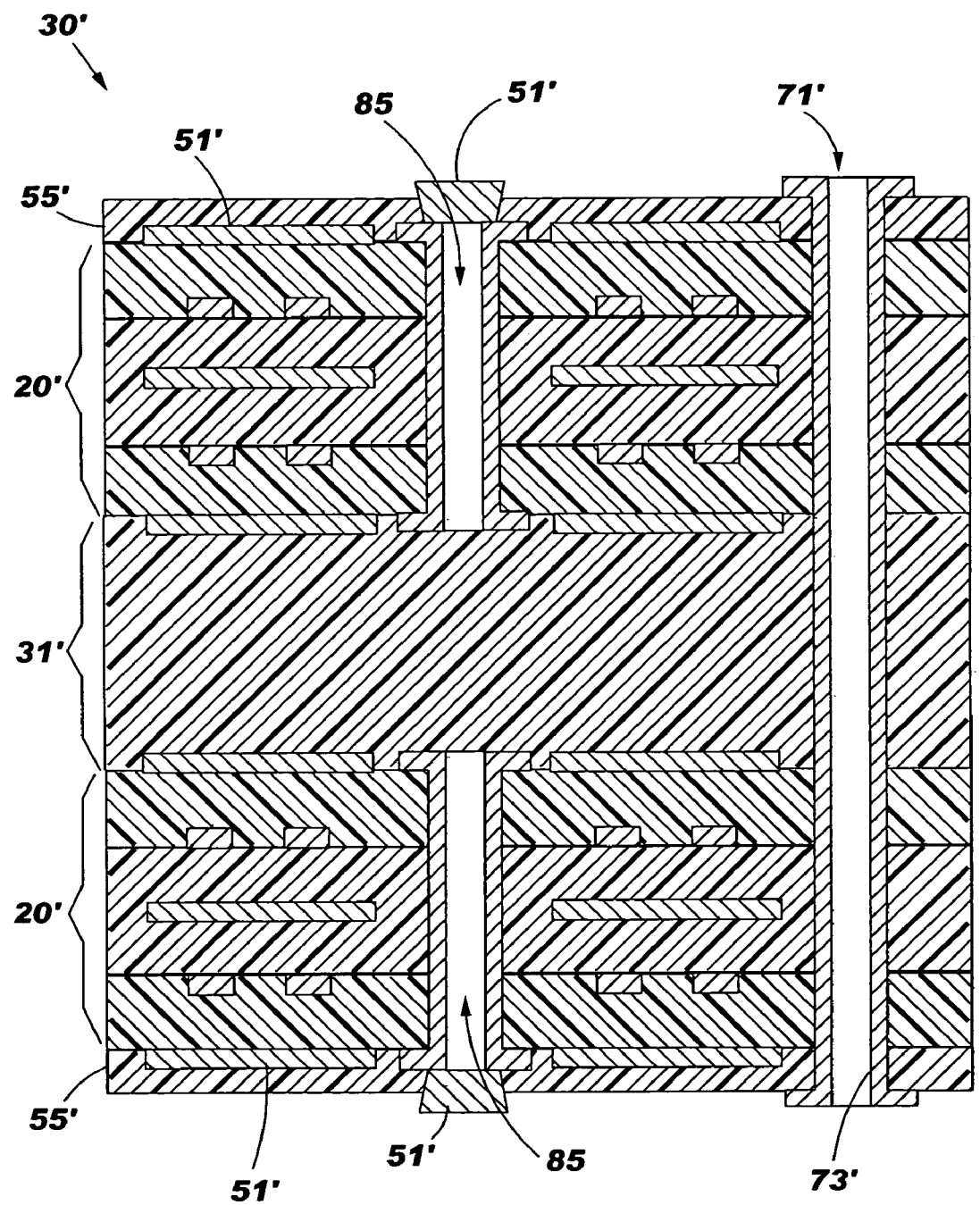
FIG. 4 is a side elevational view, in section, of a multilayered PCB according to another aspect of the invention in the parent application.

In FIG. 4, two second multilayered portions 20' are shown bonded to a common, interim multilayered first portion 31' which, in a preferred embodiment in the parent and as stated above, includes several internal conductive planes (not shown) bonded by a corresponding number of individual dielectric layers (also not shown) to form the elements of a multilayered circuitized substrate assembly, referred to in the parent application as a pcb. The embodiment of FIG. 2 thus represents a simpler means of producing a final PCB (30' in FIG. 4) because of the fewer lamination steps necessary during the final bonding operations. That is, it is only necessary to laminate the three previously formed multilayered structures 20' and 31' shown in FIG. 4. Again, it is noteworthy that only one outer portion 20' may be bonded to an underlying conventional pcb 31' in accordance with the broader aspects of this invention. Following complete lamination, an outer dielectric layer 55' may be added to the structure and a conductive opening 51' provided therein using similar techniques to those defined for providing the opening 45 and conductive material 51 in FIG. 3. A plated thru-hole 85 will couple any component joined to material 51' to the top and/or bottom layers of portion 20', if desired. To couple the outermost surfaces of PCB 30', a common thru-hole 71' is provided, similarly to thru-hole 71 in FIG. 3. Such a thru-hole would preferably include the plated conductive material 73' similar to that in FIG. 3.

Of further significance, the thru-holes 71 and 71' can be used to electrically couple one or more of the electrical components to the internal wiring of the first multilayered portions 31 and 31', respectively, thus providing a direct electrical connection between these components and the interim structure. Thus, the present invention provides the unique capability of assuring coupling between the components on one side of the board in addition to coupling of these same components to internal conductive planes of the base or first portion of the overall structure. Such dual coupling represents a significant aspect of the invention because it results in a final product having greater operational capabilities than heretofore known products.

Figure 5:
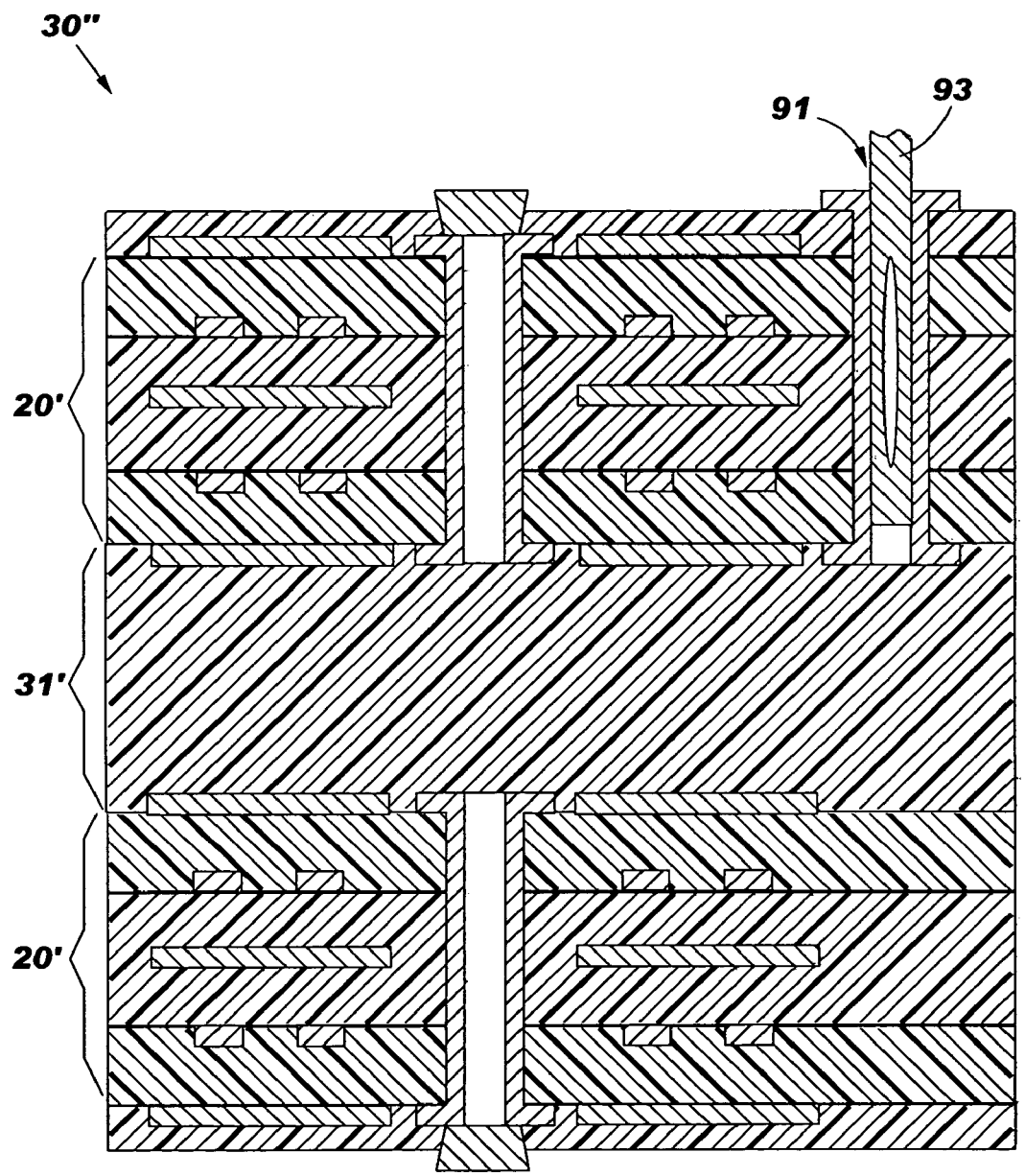
FIG. 5 is a side elevational view, in section, of a multilayered PCB according to yet another aspect of the invention in the parent application.
Figure 6:
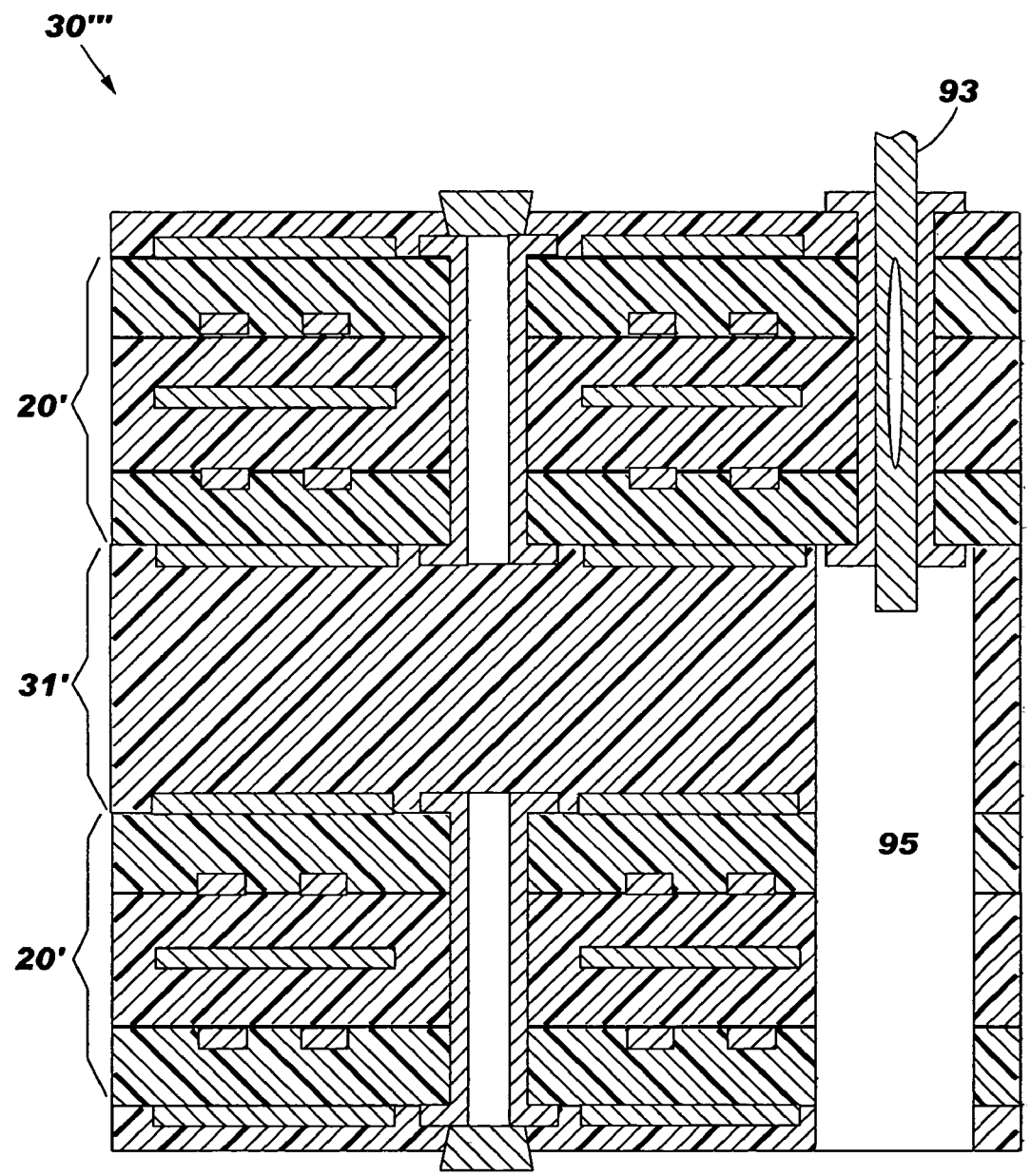
FIG. 6 is a side elevational view, in section, of a multilayered PCB according to still another aspect of the invention in the parent application.

In FIGS. 5 and 6, there are shown two alternative embodiments 30" and 30'", respectively, of the parent application invention. The structure of pcb 30' in FIG. 5 is similar to that shown in FIG. 4 with the addition of a conductive thru-hole 91 extending from an outer surface to one of the conductive planes of portion 20'. Coupling of a pinned component (i.e., the pin 93 shown in FIGS. 5 and 6) is thus possible, in addition to the afore-defined coupling of additional electronic components. In the embodiment of FIG. 6, an elongated opening 95 is provided through the portion 31' and the lower portion 20'. The reason for providing opening 95 is to provide proper clearance for inserting pin 93. Opening 95 can be performed (drilled) on 31' and 20' before final lamination, contrasting to the conventional method of "back drilling" in order to eliminate the unused portion of the pth. Back drilling removes a portion of the PTH layer of copper. This reduces the capacitive effects of the pth when dealing with high speed signals. Back drilling is considered relatively expensive and often difficult to perform, thereby adding also to the cost associated with the resulting products, in addition to raising a possible increased reliability factor for these products. The construction in the parent application and that taught in FIG. 9 as part of the instant invention negates the need for back drilling and achieves the same effects.

Figure 7:
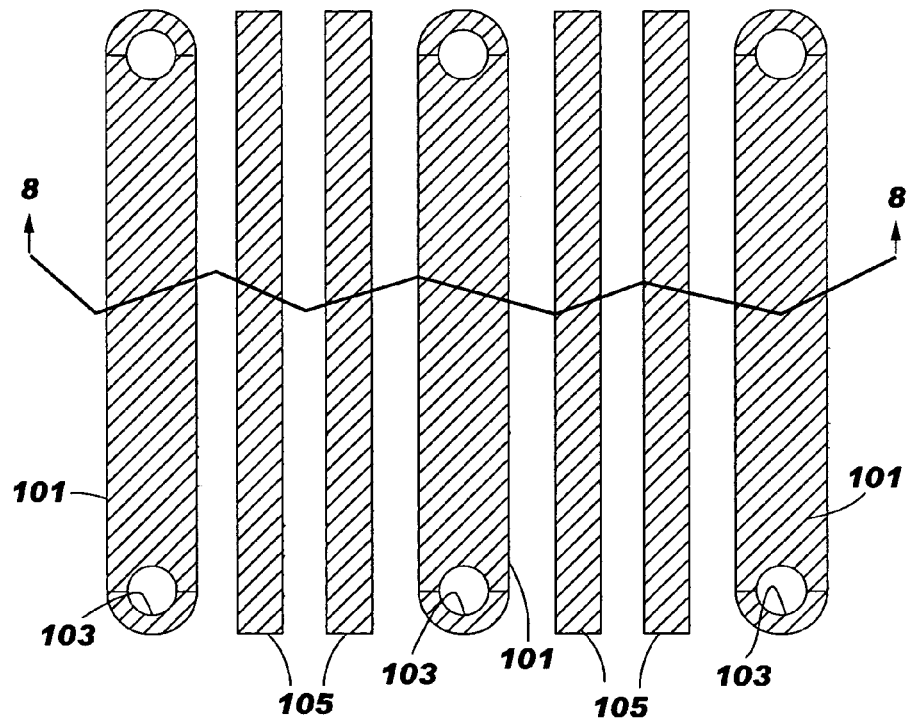
FIG. 7 is a top plan view illustrating a circuit pattern that may be used on a multilayered PCB according to one aspect of the invention in the parent application.
Figure 8:
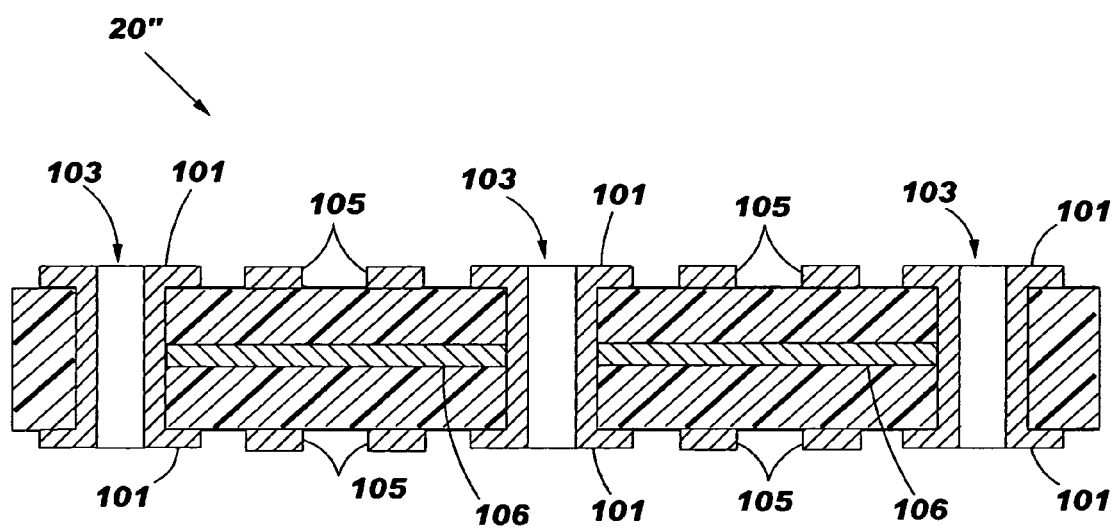
FIG. 8 is a side elevational view, in section, taken along the line 7—7 in FIG. 7.

FIGS. 7 and 8 represent an embodiment of a second portion 20" according to another aspect of the invention in the parent application. Understandably, FIG. 8 is a sectional view taken along the line 8—8 in FIG. 7 and serves to illustrate one embodiment of the respective widths of conductors on the upper surface of portion 20". The thru-holes located at respective ends of the broader width conductors are also shown. In this arrangement, the broader width conductors 101 serve as signal lines to interconnect plated thru-holes 103 at the opposite ends thereof. In comparison, the narrower width signal lines 105 extend in paired relationship between the respective outer pairs of the wider lines 101. In one embodiment, lines 101 may possess a width of from about 0.003 inch to about 0.012 inch while the corresponding internal, narrower lines each may possess a width of 0.002 inch to about 0.010. These lines were spaced apart a distance of from about 0.003 inch to about 0.012 inch. The purpose of providing the greater width lines 101 on opposite sides of the paired narrower signal lines 105 is to provide proper trace impedance control as well as signal shielding to minimize noise coupling amongst signal lines. As seen in FIG. 8, these lines are positioned on opposite sides of portion 20" with the narrower lines 105 located externally of an interim conductive (e.g., power) plane 106 coupled to the center pth 103. This arrangement provides the advantageous feature of a continuous reference plane that can provide maximum signal shielding. This provides for simpler construction of sub-composites and also allows for sections with Z connections that can have different dielectric thicknesses; for example, fast signals vs. slower signals.

Figure 9:
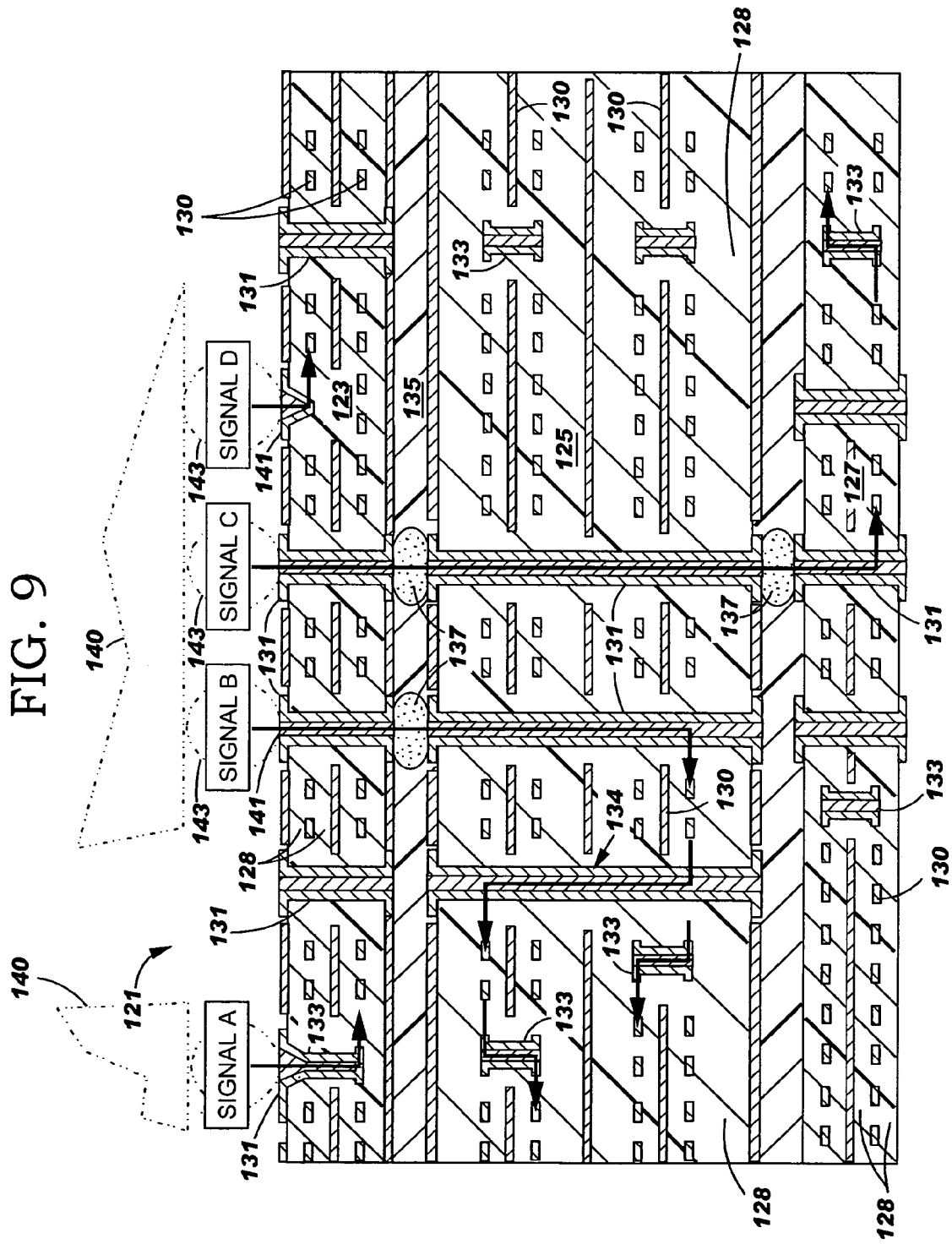
FIG. 9 is a side elevational view, in section, of a high speed circuitized substrate according to one embodiment of the present invention.

In FIG. 9, there is shown a multilayered high speed circuitized substrate assembly 121 in accordance with one embodiment of the invention. Assembly 121 includes at least two (and preferably more) individual circuitized substrates 123, 125 and 127 each having multiple layers 128 of dielectric with electronically conductive layers 130 alternately positioned therein. The conductive layers 130, like those in the afore-defined portions 20 and 20', are electrically insulated from each other by the interim dielectric layers 128. Each substrate includes a plurality of thru-holes therein, which may be of one or more of the three types mentioned above. For example, interim substrate 125 includes both plated thru holes 131 and buried (internal) vias 133 therein, while substrate 123 includes plated thru holes 131 and a blind via 135. Substrate 127 includes plate thru-holes 131 and two buried vias 133. The number of thru-holes shown is for illustration only and it is understood that each substrate may include several more than illustrated. The same is true for the number of illustrated conductive and dielectric layers. In one example of the invention, each substrate 123, 125 and 127 may include from two to twelve dielectric layers 128, from three to thirteen electrically conductive layers 130, and anywhere from about twenty to about fifty thousand thru-holes of the types shown, the latter indicating the relatively high densities attainable using the teachings of this invention. As mentioned above, each substrate may be formed with one or more thru-holes therein prior to being bonded (laminated) to the others. Alternatively, in the case of plated thru-holes, the substrates may be laminated together to form the assembly in FIG. 9 and at least some of such holes provided (e.g., using mechanical drilling or lasers) through the entire thickness of the assembly. Several combinations of these three thru-hole arrangements are thus possible and well within the scope of one versed in the art.

In the embodiment of FIG. 9, it is understood that the first circuitized substrate 123 is separated from the interim circuitized substrate 125 by an interim dielectric layer 135, the same also true for the third circuitized substrate 127 and interim substrate 125. This interim dielectric layer is preferably a sticker sheet as defined above and thus provides a dielectric layer between the respective substrates. To electrically connect the exposed ends of the illustrated plated thru-holes 131, a quantity of paste 137 is preferably used. In FIG. 9, two such quantities are used to provide two connections between substrate 123 and 125 while only one is used to electrically connect substrate 125 with substrate 127. This number of paste connections is provided only for illustration purposes and not meant to limit the invention in that several other paste-type connections may be made, depending on the final operational requirements for the finished product. For example, it is also possible to couple the plated thru-hole 131 at the far left in substrate 123 with that plated thru-hole immediately below it in substrate 125. Such connections are essential, of course, to enable passage of signals from one substrate to the other. In the illustrated example of FIG. 9, it is not desired to conduct signals at this last location and so a connection is not provided.

As in the invention defined in the parent application cited above, it is within the scope of the invention that the frequency of signals passing within the outer substrates 123 and 127 may be greater than that of the interim substrate 125, and vice versa. Understandably, one or both of the outer substrates may be directly coupled to external components such as chip carriers and/or semiconductor chips. Two such components, chip carriers 140, are partly shown, in phantom, in FIG. 9, and only on one side, the upper, of upper substrate 123. The assembly 121 would thus possess the ability to pass signals at higher speeds and thus greater frequency within the outer substrate 123 (and 127 if components were mounted on same) than those within the interim substrate 125, if it is desired to couple components on the side shown. As stated, it is within the scope of the invention to couple components on opposite sides and thus provide the outer substrates with similar high speed frequency capability. In such a structure, these outer components would be coupled to each other on the same side, whereas if it is desired to couple the oppositely positioned components to one another, the interim substrate can also be formed to have high speed capability. Assembly 121 is uniquely able to provide all of these possible coupling combinations. Notably, the use of a lesser than high speed interim substrate enables provision of a lower cost assembly 121 because the interim substrate can be comprised of conventional, non-high speed signal and power layers, and thus at reduced cost in comparison to processes utilized in making high speed substrates.

Components 140, whether chip carriers, semiconductor chips, or the like, are preferably coupled to respective conductive pads 141 using the afore-defined solder balls, now represented by the numeral 143. Such connections are preferred also for opposite side components (not shown) should these be utilized. The circuitized substrate assembly 121 defined herein utilizes substantially the entire thickness thereof (all three substrates 123, 125 and 127) to electrically couple two or more such components on the upper side. The example illustrated below is for this purpose.

As stated, each of the circuitized substrates 123, 125 and 127 in FIG. 9 are capable of passing high speed signals when such signals pass through the assembly 121. In FIG. 9, four signals A–D are represented for explanation purposes as examples of how these signals may pass within the assembly 121 from one component 140 back to another component 140, whether the second component 140 is mounted immediately adjacent the first or at a greater distance on the multilayered substrate assembly. Examples of how such couplings are possible are now explained. Signal A is shown as passing from the component 140 on the left in FIG. 9 downward through the blind via thru-hole 135 and along a signal plane to another respective thru-hole (not shown) and then back to the other component 140. As specifically seen, signal A utilizes the maximum length of the plated blind thru-hole and thus no thru-hole "stub" exists which could cause signal degradation. Similarly, signal D passes downwardly from the right component 140 to the first signal layer within substrate 123 and thereafter to respective other conductors, including possibly another blind plated thru-hole (not shown) where it returns upwardly to another component or possibly even to another contact on the same component 140.

Signals B and C represent perhaps the best illustration of thru-hole stub substantial elimination when using signals which pass substantially within the assembly thickness. Signal B is shown to pass from the left conductor of component 140 down through the entire thickness of substrate 123 and substantially the full length of the plated thru-hole 131 within interim substrate 125. It then passes to the left of the viewer along the lower signal plane of substrate 125 and upwardly through the adjacent plated thru-hole 134 to the uppermost signal layer of substrate 125. In this case, it then passes downwardly through the internal via thru-hole 133 to the second signal layer within substrate 125. During this travel, the signal B passes through substantially the maximum length of each plated thru-hole to thus reduce stub. It is seen that only a minor length of plated thru-hole remains for each of the thru-holes through which the signal B passes as shown in FIG. 9. Alternatively, signal B may pass along the lower signal plane in substrate 125 and to the adjacent internal via thru-hole 133 where it then passes upwardly to the second signal plane from the substrate 125 lower surface. This also substantially eliminates stub interference because only a small portion of the entire plated thru-hole 131 is utilized. Stub reduction is thus greater here than in the alternative path for signal B described above.

Signal C is shown to pass through substantially the entire thickness of assembly 121 and from the plated thru-holes 131 (forming one continuous thru-hole) to the lowermost signal layer formed within substrate 127. It is then shown to pass to the internal via 133 to the right in FIG. 9 where it moves upwardly to the second signal layer within substrate 127. Signal C thus is passed with virtually no stub loss because only a minimum stub length remains for the common plated thru-holes within the aligned substrates. Importantly, the remaining stub for thru-hole 131 not used for signal C passage is no longer than the one wire (trace) width for the signal lines also carrying the signal. This is true for the remaining signal paths in assembly 121.

It is thus seen that each circuitized substrate 123, 125 and 127 which form part of the assembly 121 provide high speed signal passage there-through with virtually no stub loss occurring. This unique capability is attained by providing new and unique routing paths for the signals to pass through the substrates such that these signals utilize substantially the full length of each of the thru-holes through which the signals pass while, significantly, not passing along any greater length of the thru-holes than needed. In some of these paths, only a small portion of each thru-hole, no longer than one line width, is not utilized and thus signal loss is substantially eliminated. In most paths, the entire length is used. The unique passage as taught herein is attained using the variety of thru-holes described above as well as using conventional dielectrics and conductive layers, as well as alternative means for bonding various circuitized substrates together. In the example of FIG. 9, it is possible to still attain these speeds while using conductive paste to couple respective thru-holes and thus adjacent substrates. It is understood that the signal passages illustrated herein are representative only and not limitive of the invention. Several other combinations of thru-holes and signal planes are readily possible using the teachings herein.

It is also within the scope of the invention to provide thru-holes with electrically conductive paste therein to assure enhanced signal passage. Such paste, similar to that of paste 137, may be positioned within the respective thru-holes and then the substrates containing same bonded to one another using the afore-mentioned lamination steps. Should an assembly 121 be formed wherein plated thru-holes are subsequently also provided through the entire length of the assembly, it is also possible to thereafter place the conductive paste within such subsequently formed plated thru-holes for the purposes defined herein. It is also understood that in the broader aspects of the invention, a circuitized substrate assembly may include only two individual substrates (i.e., 123 and 125).

Figure 10:
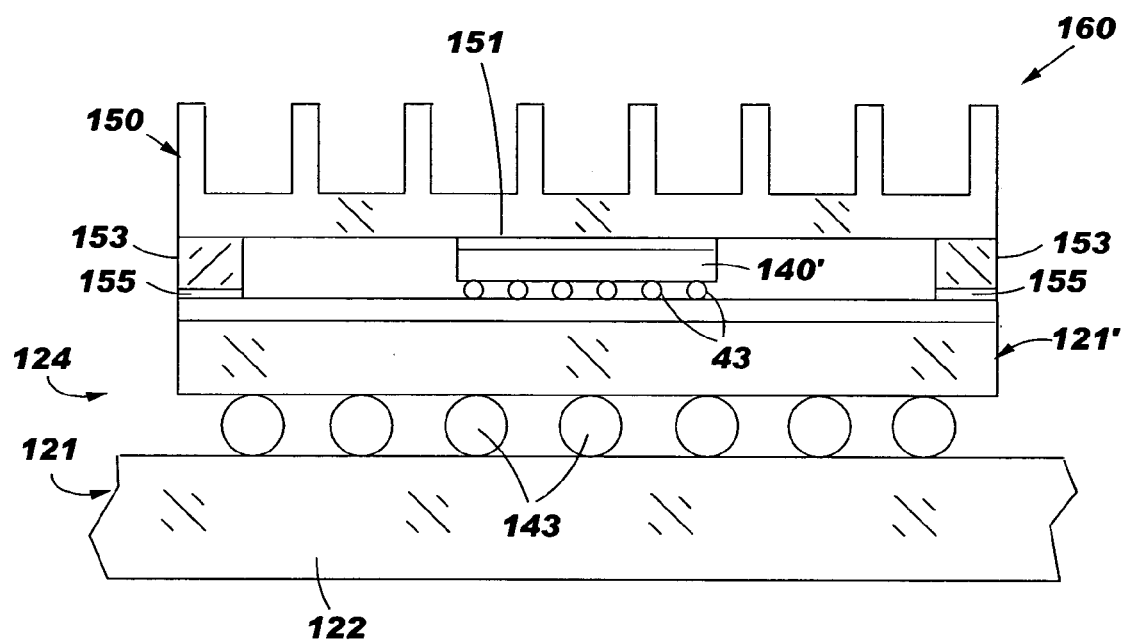
FIG. 10 is a side elevational view of an electrical assembly capable of utilizing one or more of the circuitized substrates of the instant invention.

FIG. 10 illustrates two examples of electrical assemblies which may be formed using the teachings of the instant invention. One assembly, the multi-layered high speed circuitized substrate assembly 121, includes a pcb 122 and a chip carrier 124, the chip carrier 124 (having a semiconductor chip 140' thereon) representing the second high speed circuitized substrate assembly. Carrier 124 includes its own substrate assembly 121' and at least one semiconductor chip 140' mounted thereon (or, in some chip carriers, within a sealed dielectric) using conventional solder balls 143 of the type defined herein. Similarly, solder balls 143 are used to couple the circuitized substrate assembly 121' to pcb 122. Thus it is possible to provide high speed signals from chip 140' to pcb 122 and onto other electrical assemblies or, simply, components (not shown) mounted on pcb 122 using the teachings of the present invention. The preferred assembly using circuitized substrate assembly 121', as stated, is also referred to as a chip carrier and typically includes additional elements such as a heat sink 150 thermally coupled to the chip using a conductive adhesive 151. A pair of spacers 153 may be provided to assure positioning of the heat sink, these spacers 153 also bonded to the carrier substrate's upper surface using appropriate bonding adhesive 155. The chip carrier shown in FIG. 10 is for illustration purposes only because other forms of chip carriers are known in the art and within the scope of the present invention. One well-known such chip carrier is sold by the assignee of the present invention under the name HyperBGA chip carrier (HyperBGA being a registered trademark of Endicott Interconnect Technologies, Inc.). Further description is not believed necessary.

Figure 11:
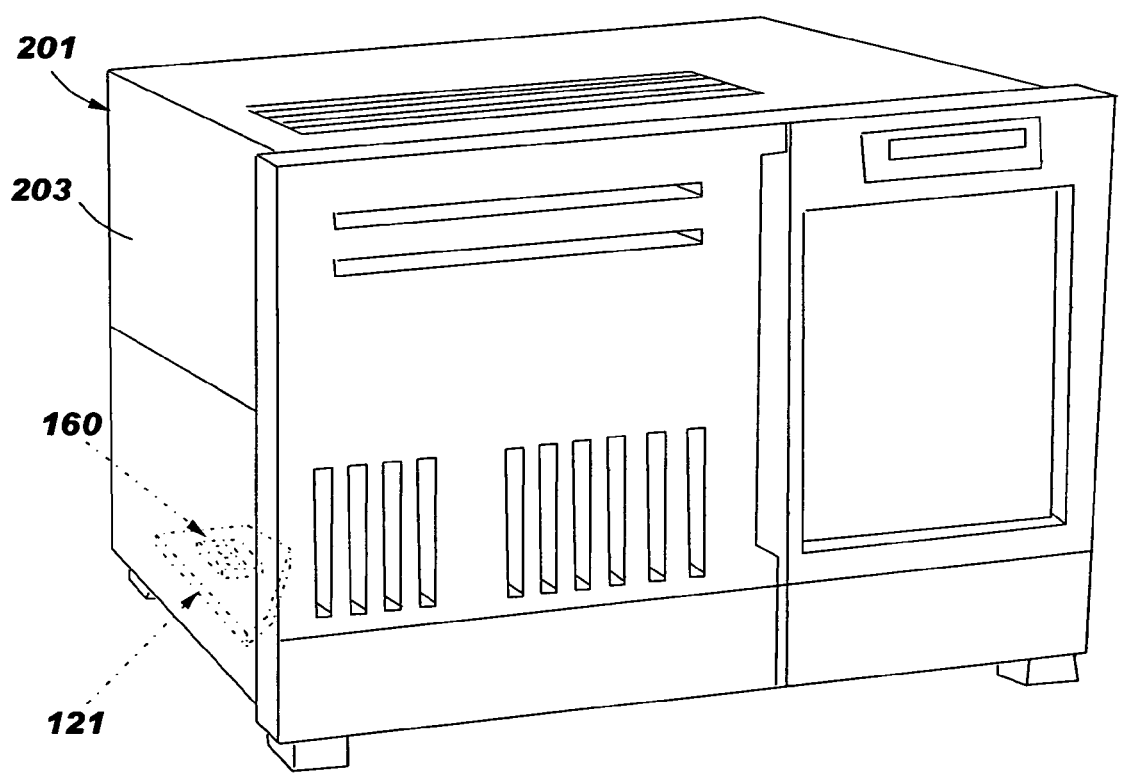
FIG. 11 is a perspective view of an information handling system capable of using one or more circuitized substrates (and, possibly, electrical assemblies) of the instant invention.

FIG. 11 illustrates an information handling system 201 according to one embodiment of the invention. Information handling system 201, as defined above, may be a personal computer, mainframe computer, computer server or other types of information handling systems known in the art. Typically, such systems utilize a housing 203 in which is positioned the system's functioning components. As defined herein, one such functioning component can be an electrical assembly including a multilayered circuitized substrate assembly or, if possible, simply one circuitized substrate having one or more electrical components positioned thereon, as part thereof. The embodiment of FIG. 11 is shown to include the circuitized substrate assembly 121 shown in FIG. 10 having the described chip carrier 124 mounted thereon as shown in FIG. 10, this entire assembly illustrated by the numeral 160 in both FIGS. 10 and 11. As stated, the multilayered circuitized substrate assembly 121 in FIG. 11 also preferably includes several additional electrical components mounted thereon. Further description is not believed necessary.

Thus there has been shown and described a circuitized substrate and a multilayered circuitized substrate assembly, as well as a method of making the substrate and products adapted for using same, which provide high speed connecting of various components such as chip carriers and/or semiconductor chips and other electrical components located on one surface, in addition to coupling these components to internal conductors of the substrate and/or to components on the opposite side, if desired. In its simplest form, the circuitized substrate as taught herein includes one substrate with a plurality of dielectric and conductive layers, and a plurality of thru-holes. In its simplest form, the multilayered circuitized substrate assembly includes at least two such circuitized substrates bonded together to form the ultimate multilayered structure, which itself will include pluralities of thru-holes as deemed necessary to couple the respective conductive layers and assure high speed signal passage as needed. In its simplest form, the information handling system as taught herein will include at least one circuitized substrate and one component but it is understood that in many cases, the system will utilize substrate assemblies in order to provide more enhanced high speed coupling capabilities. The invention as defined herein is capable of coupling components on a single side of a substrate as well as those on opposite surfaces as well. The methods taught herein for producing such a structure are cost effective and well within the capabilities of those versed in the substrate (especially the pcb) manufacturing art. Thus, the invention can be produced at relatively low costs to the ultimate consumer.

While there have been shown and described what are at present the preferred embodiments of the invention, it will be obvious to those skilled in the art that various changes and modifications may be made therein without departing from the scope of the invention as defined by the appended claims.

What is claimed is:

1. A high speed circuitized substrate comprising:
a plurality of electrically conductive layers;
a plurality of dielectric layers alternately positioned between selected pairs of said electrically conductive layers and electrically insulating said conductive layers from each other;
a plurality of thru-holes spacedly positioned within said substrate and extending through selected ones of said dielectric layers and said electrically conductive layers for electrically interconnecting selected ones of said electrically conductive layers to another of said electrically conductive layers to allow the passage of electrical signals between said interconnected electrically conductive layers, said electrical signals passing through the maximum length of said thru-holes so as to substantially eliminate signal loss due to thru-hole stub, said thru-holes within said substrate including a combination of internal vias, blind vias and plated through holes.

2. The high speed circuitized substrate of claim 1 wherein said plurality of electrically conductive layers are comprised of copper.

3. The high speed circuitized substrate of claim 1 wherein said plurality of dielectric layers are of a material selected from the group of materials consisting of fiberglass-reinforced epoxy resin, polytetrafluoroethylene, polyimide, polyamide, cyanate resin, photoimageable material, and combinations thereof.

4. The high speed circuitized substrate of claim 1 wherein said electrical signals are capable of passing through said substrate at a rate of from about 3.0 to about 10.0 gigabits per second.

5. The high speed circuitized substrate of claim 1 wherein the number of electrically conductive layers is from about three to about thirteen, the number of dielectric layers is from about two to about twelve, and the number of thru-holes is from about twenty to about fifty thousand.

6. A method of making a high speed circuitized substrate, said method comprising:
providing a plurality of electrically conductive layers;
providing a plurality of dielectric layers and alternately positioning selected ones of said dielectric layers between selected pairs of said electrically conductive layers so as to electrically insulate said conductive layers from each other;
forming a plurality of thru-holes within said substrate in a spaced orientation such that said plurality of thru-holes extend through selected ones of said dielectric layers and said electrically conductive layers to electrically interconnect selected ones of said electrically conductive layers to another of said electrically conductive layers so as to allow the passage of electrical signals between said interconnected electrically conductive layers, said electrical signals passing through the maximum length of said thin-holes so as to substantially eliminate
signal loss due to thru-hole stub, said forming of said plurality of thru-holes being accomplished using a laser.

7. The method of claim 6 further including bonding said plurality of electrically conductive layers and said plurality of dielectric layers together.

8. The method of claim 7 wherein said bonding is accomplished using a lamination process.

9. The method of claim 6 wherein said plurality of thru-holes include a layer of plated metal.

10. An electrical assembly comprising:
a high speed circuitized substrate including a plurality of electrically conductive layers, a plurality of dielectric layers alternately positioned between selected pairs of said electrically conductive layers and electrically insulating said conductive layers from each other, a plurality of thru-holes spacedly positioned within said substrate and extending through selected ones of said dielectric layers and said electrically conductive layers for electrically interconnecting selected ones of said electrically conductive layers to another of said electrically conductive layers to allow the passage of electrical signals between said interconnected electrically conductive layers, said electrical signals passing through the maximum length of said thru-holes so as to substantially eliminate signal loss due to thru-hole stub, said thru-holes within said substrate including a combination of internal vias, blind vias and plated through holes; and
at least one electrical component positioned on and electrically coupled to said circuitized substrate.

11. The electrical assembly of claim 10 wherein said plurality of electrically conductive layers are comprised of copper.

12. The electrical assembly of claim 10 wherein said plurality of dielectric layers are of a material selected from the group of materials consisting of fiberglass-reinforced epoxy resin, polytetrafluoroethylene, polyimide, polyamide, cyanate resin, photoimageable material, and combinations thereof.

13. The electrical assembly of claim 10 wherein said electrical signals are capable of passing through said substrate at a rate of from about 3.0 to about 10.0 gigabits per second.

14. The electrical assembly of claim 10 wherein the number of electrically conductive layers is from about three to about thirteen, the number of dielectric layers is from about two to about twelve, and the number of thru-holes is from about twenty to about fifty thousand.

15. The electrical assembly of claim 10 wherein said at least one electrical component comprises a semiconductor chip.

16. The electrical assembly of claim 10 wherein said at least one electrical component comprises a chip carrier.

17. A high speed circuitized substrate assembly comprising:
a first high speed circuitized substrate including a first plurality of electrically conductive layers and a first plurality of dielectric layers alternately positioned between selected pairs of said first electrically conductive layers and electrically insulating said first electrically conductive layers from each other;
a second high speed circuitized substrate including a second plurality of electrically conductive layers and a second plurality of dielectric layers alternately positioned between selected pairs of said second electrically conductive layers and electrically insulating said second electrically conductive layers from each other, said second circuitized substrate bonded to said first circuitized substrate to form a circuitized subassembly; and
a plurality of thru-holes positioned with said high speed circuitized subassembly and electrically interconnecting selected ones of said first and second pluralities of electrically conductive layers to allow the passage of electrical signals between said interconnected electrically conductive layers, said electrical signals passing through the maximum length of said thru-holes so as to substantially eliminate signal loss due to thru-hole stub, said thru-holes within said substrate including a combination of internal vias, blind vias and plated through holes.

18. The high speed circuitized substrate assembly of claim 17 wherein said first and second pluralities of electrically conductive layers are comprised of copper.

19. The high speed circuitized substrate assembly of claim 17 wherein said first and second pluralities of dielectric layers are of a material selected from the group of materials consisting of fiberglass-reinforced epoxy resin, polytetrafluoroethylene, polyimide, polyamide, cyanate resin, photoimageable material, and combinations thereof.

20. The high speed circuitized substrate assembly of claim 17 wherein said electrical signals are capable of passing through said substrate at a rate of from about 3.0 to about 10.0 gigabits per second.

21. The high speed circuitized substrate assembly of claim 17 wherein the number of electrically conductive layers is from about three to about thirteen, the number of dielectric layers is from about two to about twelve, and the number of thru-holes is from about twenty to about fifty thousand.

22. The invention of claim 17 wherein said circuitized substrate assembly comprises a printed circuit board.

23. The invention of claim 17 wherein said circuitized substrate assembly comprises a chip carrier.

24. The invention of claim 23 further including at least one semiconductor chip positioned on or within said chip carrier and forming part thereof.

25. An information handling system comprising:
a housing;
a high speed circuitized substrate positioned within said housing and including a plurality of electrically conductive layers, a plurality of dielectric layers alternately positioned between selected pairs of said electrically conductive layers and electrically insulating said conductive layers from each other, a plurality of thru-holes spacedly positioned within said substrate and extending through selected ones of said dielectric layers and said electrically conductive layers for electrically interconnecting selected ones of said electrically conductive layers to another of said electrically conductive layers to allow the passage of electrical signals between said interconnected electrically conductive layers, said electrical signals passing through the maximum length of said thru-holes so as to substantially eliminate signal loss due to thru-hole stub, said thru-holes within
said substrate including a combination of internal vias, blind vias and plated through holes; and
at least one electrical component positioned on and electrically coupled to said circuitized substrate.

26. The invention of claim 25 wherein said information handling system comprises a personal computer.

27. The invention of claim 25 wherein said information handling system comprises a mainframe computer.

28. The invention of claim 25 wherein said information handling system comprises a computer server.

29. A method of making a high speed circuitized substrate, said method comprising:

provide a plurality of electrically conductive layers;

providing a plurality of dielectric layers and alternately positioning selected ones of said dielectric layers between selected pairs of said electrically conductive layers so as to electrically insulate said conductive layers from each other;

forming a plurality of thru-holes including a combination of internal vias, blind vias and plated through holes within said substrate in a spaced orientation such that said plurality of thru-holes extend through selected ones of said dielectric layers and said electrically conductive layers to electrically interconnect selected ones of said electrically conductive layers to another of said electrically conductive layers so as to allow the passage of electrical signals between said interconnected electrically conductive layers, said electrical signals passing through the maximum length of said thru-holes so as to substantially eliminate signal loss due to thru-hole stub.

* * * * *

UNITED STATES PATENT AND TRADEMARK OFFICE
CERTIFICATE OF CORRECTION

PATENT NO. : 6,995,322 B2
APPLICATION NO. : 10/955741
DATED : February 7, 2006
INVENTOR(S) : B. Chan et al.

It is certified that error appears in the above-identified patent and that said Letters Patent is hereby corrected as shown below:

Claim 6, line 63 - delete "thin" and insert "thru";

line 64 - delete

"stantially eliminate signal loss due to thru-hole stub, said forming of said plurality of thru-holes being accomplished using a laser."

and insert

"stantially eliminate signal loss due to thru-hole stub, said forming of said plurality of thru-holes being accomplished using a laser."

Claim 25, line 57 - delete

"loss due to thru hole stub, said thru-holes within said substrate including a combinagion of interval vias, blind vias and plated through holes; and"

and insert

"loss due to thru hole stub, said thru-holes within said substrate including a combinagion of interval vias, blind vias and plated through holes; and"

Signed and Sealed this

Eighth Day of August, 2006

JON W. DUDAS
*Director of the United States Patent and Trademark Office*